(12) United States Patent
Perumana et al.

(10) Patent No.: US 12,531,572 B2
(45) Date of Patent: Jan. 20, 2026

(54) COMBINED IQ-POLAR RADIO FREQUENCY DIGITAL-TO-ANALOG-CONVERTER (RFDAC) SYSTEMS AND METHODS

(71) Applicant: Apple Inc., Cupertino, CA (US)

(72) Inventors: Bevin G Perumana, Anaheim, CA (US); Saikat Sarkar, Irvine, CA (US); Tirdad Sowlati, Irvine, CA (US)

(73) Assignee: Apple Inc., Cupertino, CA (US)

( * ) Notice: Subject to any disclaimer, the term of this patent is extended or adjusted under 35 U.S.C. 154(b) by 232 days.

(21) Appl. No.: 18/310,786

(22) Filed: May 2, 2023

(65) Prior Publication Data

US 2024/0372560 A1    Nov. 7, 2024

(51) Int. Cl.
*H03M 1/66* (2006.01)

(52) U.S. Cl.
CPC .......... *H03M 1/662* (2013.01); *H03M 1/665* (2013.01)

(58) Field of Classification Search
CPC ........ H03M 1/66; H03M 1/662; H03M 1/745; H03M 1/004; H03M 1/0626; H03M 1/661; H03M 1/664; H03M 1/68; H03M 1/72; H03M 1/747; H03M 1/78; H03M 3/00; H03F 2200/451; H03F 3/245; H03F 1/0288; H03F 1/0222; H03F 1/0227; H03F 1/32; H03F 1/3241; H03F 3/211; H03F 1/025; H03F 1/0277; H03F 1/30; H03F 1/301; H03F 1/3205; H03F 1/3223; H03F 1/3252; H03F 1/42; H03F 2200/102; H03F 2200/324; H03F 2200/331; H03F 2200/336; H03F 2200/447; H03F 2200/69; H03F 2201/3215; H03F 2203/21106; H03F 2203/21139; H03F 2203/21142; H03F 3/193; H03F 3/195; H03F 3/21; H03F 3/2171; H03F 3/2173; H03F 3/2175; H03F 3/2178; H03F 3/24; H03G 3/3042; H03C 5/00; H03C 1/52; H03C 2200/0058; H03C 3/0916; H03C 3/0925; H03C 3/0933; H03C 3/0975
USPC ......................................... 341/140–142, 144
See application file for complete search history.

(56) References Cited

U.S. PATENT DOCUMENTS

| | | | |
|---|---|---|---|
| 6,998,914 B2* | 2/2006 | Robinson ................ | H03C 5/00 330/10 |
| 7,792,213 B1* | 9/2010 | Lee ........................ | H04L 27/362 375/297 |
| 8,509,351 B1* | 8/2013 | Khlat ...................... | H03C 5/00 370/207 |
| 9,270,509 B1* | 2/2016 | Agon ..................... | H04L 27/361 |
| 9,867,155 B1* | 1/2018 | Tertinek ............... | H04W 56/003 |
| 9,979,404 B1 | 5/2018 | Drost et al. | |
| 10,116,341 B1* | 10/2018 | Menkhoff ................ | H03F 3/19 |
| 10,382,246 B2 | 8/2019 | Lee | |
| 10,904,066 B2 | 1/2021 | Menkhoff | |
| 2009/0201084 A1* | 8/2009 | See ....................... | H03F 1/3282 330/51 |
| 2015/0092636 A1 | 4/2015 | Rofougaran et al. | |

(Continued)

*Primary Examiner* — Linh V Nguyen
(74) *Attorney, Agent, or Firm* — FLETCHER YODER PC (57) ABSTRACT

A combined radio frequency (RF) digital-to-analog converter (DAC) may include an in-phase and quadrature-(IQ-) based DAC to generate a phase component of an output RF signal and a polar-based DAC to generate an amplitude component of the RF signal. Additionally, modulation circuitry may combine the amplitude component and the phase component to generate the output RF signal.

20 Claims, 4 Drawing Sheets

(56) References Cited

U.S. PATENT DOCUMENTS

| | | |
|---|---|---|
| 2017/0005854 A1 | 1/2017 | Wolberg et al. |
| 2019/0028319 A1* | 1/2019 | Menkhoff ................ H04B 1/04 |
| 2019/0207565 A1* | 7/2019 | de Vreede ............ H04B 1/0483 |
| 2019/0386690 A1* | 12/2019 | Hashemi .................... H03F 3/21 |
| 2020/0153464 A1* | 5/2020 | Yoo ........................... H03F 1/32 |
| 2020/0266842 A1* | 8/2020 | Patel ........................ H04B 1/04 |
| 2023/0073967 A1* | 3/2023 | Cheng ..................... H04B 1/04 |

* cited by examiner

COMBINED IQ-POLAR RADIO FREQUENCY DIGITAL-TO-ANALOG-CONVERTER (RFDAC) SYSTEMS AND METHODS

BACKGROUND

This disclosure generally relates to digital-to-analog converters (DACs) such as those used in radio-frequency (RF) communications.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages or other circuits dependent upon an analog voltage signal.

In RF transceivers, RFDACs may be utilized to generate an analog output RF signal to be transmitted via one or more antennas. For example, an RF system may wirelessly communicate data with other electronic devices and/or a network by modulating radio waves at assigned transmission frequencies, based on an analog representation of the data (e.g., the output RF signal). Moreover, different types of RFDACs may be utilized depending on implementation (e.g., desired data rate, bandwidth, and/or modulation scheme). For example, polar architecture RFDACs may have increased power efficiency, but in-phase and quadrature (IQ) RFDACs may have increased bandwidth capabilities. As different types of RFDACs have different advantages and disadvantages, it is desirable to achieve an RFDAC architecture that includes the advantages of multiple different types of RFDACs.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a combined radio frequency digital-to-analog converter (RFDAC) may include an in-phase and quadrature-(IQ-) based DAC to generate a phase component of an output RF signal and a polar-based DAC to generate an amplitude component of the output RF signal. In another embodiment, a method includes generating, via a polar amplitude DAC portion of an IQ-polar RFDAC, an analog amplitude component of an output RF signal based on digital amplitude information. The method may also include generating, via an IQ RFDAC portion of the IQ-polar RFDAC, an analog phase component of the output RF signal based on digital phase information.

In yet another embodiment, RF transmission circuitry may include first DAC circuitry that generates a phase modulated signal at a carrier frequency of an RF output signal of the RF transmission circuitry based on digital data indicative of the RF output signal. The phase modulated signal may have a consistent amplitude based on the RF transmission circuitry operating in a first mode and is the RF output signal in a second mode. The RF transmission circuitry may also include second DAC circuitry that generates the RF output signal based on the digital data, the phase modulated signal, and the RF transmission circuitry operating in the first mode and is disabled based on the RF transmission circuitry operating in the second mode.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

An electronic device may use one or more digital-to-analog converters (DACs) to convert digitally coded data (e.g., coded via binary code, grey-code, thermometer code, etc.) to a corresponding analog output voltage. For example, the electronic device may transmit and receive radio frequency (RF) signals to communicate with other electronic devices. Transmission circuitry (e.g., a transceiver or transmitter) of an electronic device includes RFDACs to generate an output RF signal. In general, RFDACs may be utilized to convert a digital signal indicative of information to be transmitted to an analog output RF signal. For example, an RF system may wirelessly communicate data with other electronic devices and/or a network by modulating radio waves at assigned transmission frequencies, based on an analog representation of the data (e.g., the output RF signal).

Moreover, different types of RFDACs may be utilized depending on implementation (e.g., desired data rate, bandwidth, and/or modulation scheme) such as polar RFDACs and in-phase and quadrature (IQ) RFDACs. In general, a polar RFDAC generates an amplified analog signal (e.g., an amplitude component) at the desired power output and applies a phase modulation (e.g., a phase component) thereto, such as via a phase-locked loop (PLL). Furthermore, an IQ RFDAC may utilize in-phase (I) and quadrature (Q) phase component signals (which are orthogonal to one another) to modulate the generation of the amplitude component from digital amplitude information, thereby directly generating the output RF signal, which may be amplified thereafter to a desired power. However, in some scenarios, amplifying the modulated signal may be power intensive such that the polar REDAC would be more efficient at the same desired power output of the output RF signal. Conversely, the IQ architecture may provide for increased bandwidth capabilities beyond that of the polar architecture. For example, the integrated phase modulation of an IQ RFDAC may have higher bandwidth capabilities than a PLL of a polar RFDAC.

In some embodiments, a combined IQ-polar REDAC may utilize individual polar components such as an amplitude component and a phase component to generate the output RF signal, where the phase component is generated via an IQ architecture to achieve increased bandwidth capabilities while achieving increased power efficiency. For example, the amplitude component may be generated by a polar amplitude DAC, such as an array of digital power amplifiers (DPAs) (e.g., switched-capacitor power amplifiers) and the phase component may be generated via an IQ REDAC integrated within the IQ-polar REDAC. The IQ RFDAC may generate the phase component with a consistent amplitude and a frequency indicative of the modulation frequency of the output RF signal. By generating the amplitude component separately from the IQ architecture, secondary amplification of the modulated output RF signal may be reduced or eliminated, increasing power efficiency. Moreover, by utilizing the IQ architecture to generate the phase component of the IQ-polar REDAC, the bandwidth associated therewith may be increased.

Additionally, in some embodiments, implementations may include lower power output (e.g., higher backoff) scenarios. In such scenarios, the IQ-polar REDAC may operate in an IQ mode that disables the polar amplitude DAC and instead utilizes the IQ architecture to generate the output RF signal without polar aspects. In other words, the IQ-polar REDAC may include an IQ REDAC that operates in both the IQ mode and a combined IQ-polar mode and a polar amplitude DAC that generates the polar amplitude component during the combined IQ-polar mode and is disabled in the IQ mode.

Figure 1:
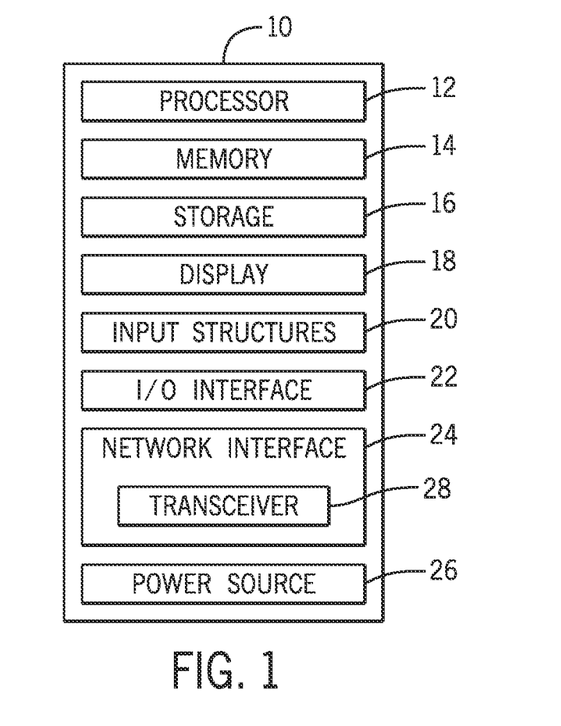
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector, a universal serial bus (USB), or other similar connector and protocol. The network interface 24 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution—(LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 24 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter.

Figure 2:
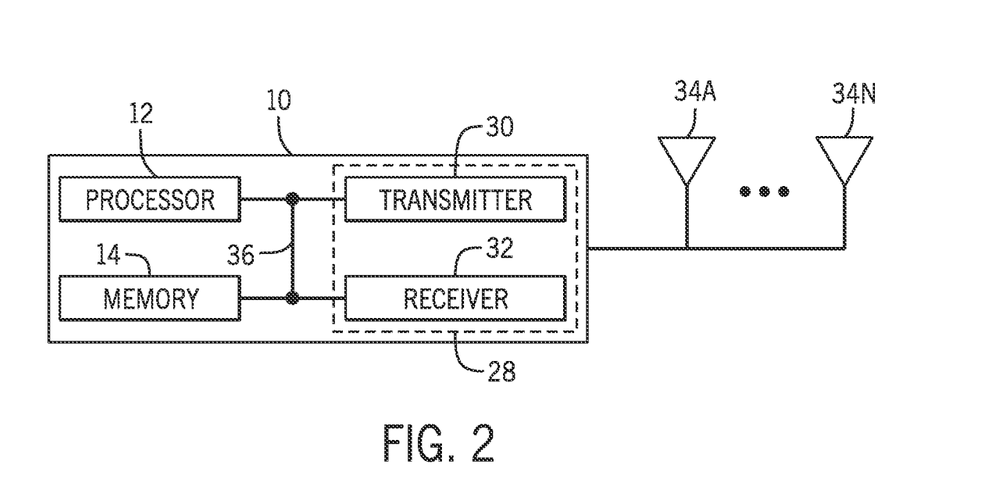
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive signals between one another.

The electronic device 10 may include the transmitter 30 and/or the receiver 32 that respectively enable transmission and reception of signals between the electronic device 10 and an external device via, for example, a network (e.g., including base stations or access points) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with one or more beams and various configurations. In some embodiments, multiple antennas of the antennas 34A-34N of an antenna group or module may be communicatively coupled to a respective transceiver 28 and each emit radio frequency signals that may constructively and/or destructively combine to form a beam. The electronic device 10 may include multiple transmitters 30, multiple receivers 32, multiple transceivers 28, and/or multiple antennas 34 as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
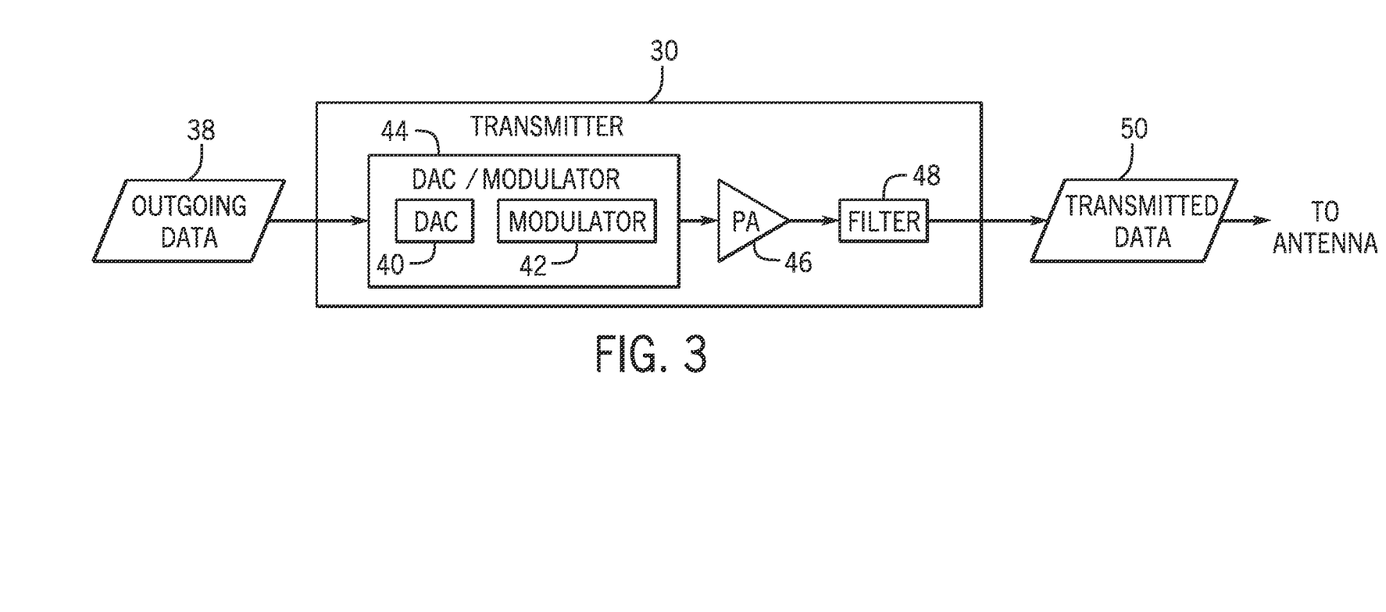
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC 40 (e.g., to be followed by a modulator 42) or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter and/or the transmitter 30 may not include the power amplifier 46 and/or filter 48.

Figure 4:
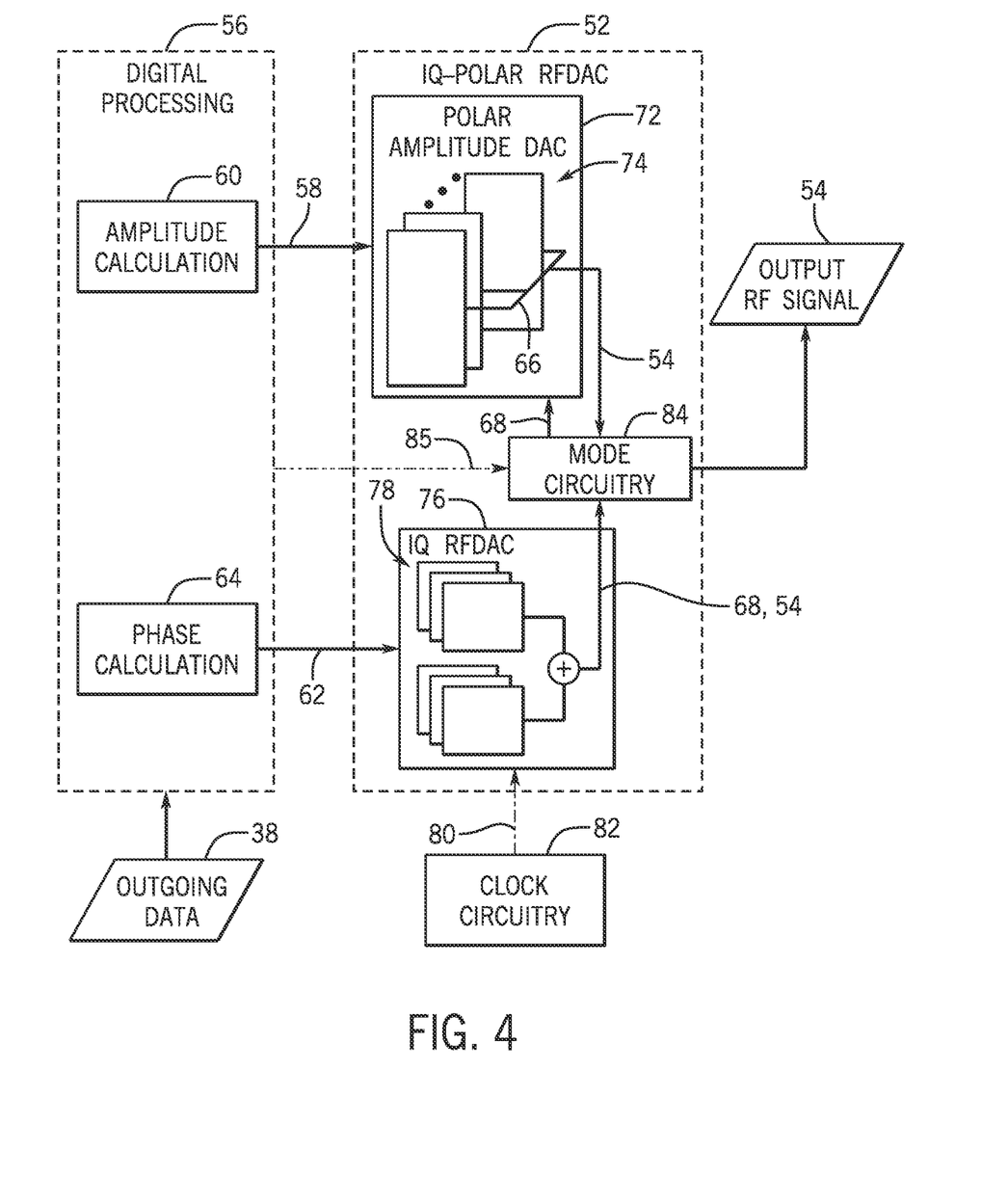
FIG. 4 is a schematic diagram of a portion of the electronic device of FIG. 1 including an in-phase and quadrature-(IQ-) polar radio frequency (RF) digital-to-analog converter (DAC) of the transmitter of FIG. 3, in accordance with an embodiment of the present disclosure.

As discussed herein, the transmitter 30 may utilize a DAC 40 to generate an analog signal indicative of the transmitted data 50 based on a digital representation of the outgoing data 38. FIG. 4 is a schematic diagram of a portion of the transmitter 30 of the electronic device 10 having an IQ-polar RFDAC 52 that generates an output RF signal 54 (e.g., indicative of the transmitted data 50) based on digital processing 56 of the outgoing data 38, according to an embodiment of the present disclosure. As discussed above, different types of RFDACs may have different advantages and disadvantages. However, the IQ-polar RFDAC 52 utilizes aspects of polar and IQ RFDAC architectures to provide for increased efficiency and increased bandwidth capabilities. Furthermore, in some embodiments, the IQ-polar RFDAC 52 may have multiple modes of operation to increase efficiency (e.g., power efficiency). For example, when operating in a combined IQ-polar mode, the IQ-polar REDAC 52 may operate in a polar architecture mode while using IQ architecture for phase aspects. Moreover, in some embodiments, the IQ-polar RFDAC 52 may operate in an IQ mode that disables the polar aspects of the IQ-polar RFDAC 52 and operates as an IQ RFDAC.

In general, a polar architecture generates an amplitude component and a phase component to be combined into the output RF signal 54. For example, digital processing 56 may be used to generate digital amplitude information 58 (e.g., via amplitude calculation 60) and digital phase information 62 (e.g., via phase calculation 64) indicative of a polar coordinate breakdown of the outgoing data 38. When operating in the combined IQ-polar mode, the IQ-polar REDAC 52 may generate the analog amplitude component 68 (based on the amplitude information 58) and an analog phase component 68 (based on the phase information 62) such that, together, they form the output RF signal 54. As should be appreciated, the output RF signal 54 may be considered the analog phase component 68 amplified by the analog amplitude component 66 or an analog amplitude component modulated by the analog phase component 68.

To generate the analog amplitude component 66 the IQ-polar REDAC 52 may include a polar amplitude DAC 72. The polar amplitude DAC 72 may be any suitable DAC capable of yielding a desired amount of power output at and capable of switching at a desired rate, which may vary depending on implementation. For example, the polar amplitude DAC 72 may be an array of digital power amplifiers (DPAs) 74, such as switched-capacitor power amplifiers, that individually enable or disable based on the amplitude information 58. In such an embodiment, the amplitude information 58 may include a binary or thermometer coded signal to enable a corresponding number of the DPAs 74 depending on the desired amplitude and/or power output of the output RF signal 54.

Additionally, the IQ-polar RFDAC 52 may include an IQ RFDAC 76 (e.g., current steering RFDAC, a switched-capacitor RFDAC, or other RFDAC utilizing I and Q signals) that, in the combined IQ-polar mode, receives the phase information 62 and generates the analog phase component 68. In general, an IQ RFDAC 76 uses in-phase and quadrature (I and Q) signals to phase modulate the output of a number unit cells 78 (dependent upon a desired output amplitude) to generate a phase-modulated output signal. Indeed, in the IQ mode, the phase calculation 64 may generate phase information 62 indicative of I and Q signals that instruct the IQ RFDAC 76 to generate the output RF signal 54 (including both the analog phase component 68 and the analog amplitude component 66).

However, in the combined IQ-polar mode, the polar amplitude DAC 72 performs the conversion of the amplitude information 58 into the analog amplitude component 66 and the IQ REDAC provides the analog phase component 68 without the analog amplitude component 66. For example, the phase information 62 may include or otherwise be indicative of the polar-converted sine and cosine information corresponding to the I and Q signals of the IQ REDAC 76. Additionally or alternatively, in some embodiments, the I and Q signals may be provided as clock information 80 via clock circuitry 82 and the phase information 62 may indicate amplitude and/or phase shifts to be applied to the clock information 80 to arrive at the desired modulation of the analog phase component 68. Moreover, as the polar amplitude DAC 72 assesses the amplitude information 58, in the combined IQ-polar mode, the IQ RFDAC may output the analog phase component 68 as a frequency modulated signal with a consistent amplitude (e.g., having the same amplitude on successive beats at the modulated frequency). As should be appreciated, the analog phase component 68 may include any suitable waveform indicative of the modulation frequency such as a sinusoidal waveform (e.g., with a set amplitude) or a square waveform (e.g., with constant amplitude pulses). Furthermore, the frequency modulation of the analog phase component 68 may be that of the carrier wave (e.g., at the carrier frequency) of the output RF signal 54.

In some embodiments, the polar amplitude DAC 72 may combine the analog amplitude component 66 and the analog phase component 68 during generation of the analog amplitude component 66. For example, the analog phase component 68 may be used to clock or otherwise gate the generation of the analog amplitude component 66, such that the analog amplitude component 66 is frequency modulated according to the phase information 62 as output from the polar amplitude DAC 72. As such, in some embodiments, the analog amplitude component may not be generated as a stand-alone signal, but rather integrated into generation of the output RF signal 54. For example, the frequency modulation may be integrated into the array of DPAs 74 such that the analog phase component 68 clocks or triggers the array of DPAs 74 to form the output RF signal 54. Alternatively, the analog amplitude component 66 may be generated and subsequently combined with the analog amplitude component. As should be appreciated, any suitable form of combining the analog amplitude component 66 and the analog phase component 68 may be performed. For example, modulation circuitry may multiply the analog amplitude component 66 and the analog phase component 68 or gate the analog amplitude component 66 according to the analog phase component 68. Moreover, such modulation circuitry may be independent circuitry or integrated into the polar amplitude DAC 72 or IQ REDAC 76. As the analog phase component 68 is used to modulate the analog amplitude component 66, the amplitude of the analog phase component 68 in the combined IQ-polar mode may be irrelevant as long as it is large enough to trigger or otherwise be registered by the polar amplitude DAC 72 or other modulation circuitry. As such, the amplitude of the analog phase component 68 may be less than or equal to the maximum output amplitude of the IQ RFDAC 76. For example, the amplitude of the analog phase component 68 may be less than 75%, less than 50%, less than 10% or less than 5% of the maximum output amplitude of the IQ REDAC 76 to reduce power consumption.

Additionally, while discussed above in the context of the combined IQ-polar mode, in some embodiments, the IQ-polar RFDAC 52 may be operable in an IQ mode. As discussed above, it may be power intensive to amplify a frequency modulated signal output from an IQ RFDAC. However, in some scenarios, such as if the desired output power of the output RF signal 54 is lower (e.g., a high backoff scenario) the output power of the IQ RFDAC may be sufficient without or with minimal additional amplification. As such, in some embodiments, the IQ RFDAC 76 may be utilized without the polar amplitude DAC 72, as in the IQ mode. In the IQ mode, the IQ RFDAC 76 may receive phase information 62 (e.g., I and Q signals) and directly generate the output RF signal 54. As should be appreciated, the phase information 62 sent to the IQ RFDAC 76 in the IQ mode may be in the same format as or different format from that sent to the polar amplitude DAC 72 in the combined IQ-polar mode. For example, in some embodiments, the phase information 62 in the IQ mode includes I and Q data that corresponds to the amplitude and phase of the output RF signal 54 instead of a polar coordinate component of the phase without the amplitude (e.g., as in the combined IQ-polar mode).

In some embodiments, mode circuitry 84 may be used to direct the analog phase component 68 and/or output RF signal 54 within the IQ-polar RFDAC 52. For example, the mode circuitry 84 may operate as a multiplexer (MUX) or switching/selection circuitry to direct the analog phase component 68 to the polar amplitude DAC 72 in the combined IQ-polar mode and bypass the polar amplitude DAC 72 in the IQ mode, outputting the output RF signal 54 from the IQ RFDAC 76. Additionally, the mode circuitry 84 may output the output RF signal 54 from the polar amplitude DAC 72 in the combined IQ-polar mode. Moreover, in some embodiments, the mode circuitry 84 may receive a mode signal 85 to determine which mode of operation to utilize.

As discussed above, the digital processing 56 may generate the amplitude information 58 and the phase information 62. As should be appreciated, the digital processing 56 may be performed by any suitable circuitry such dedicated circuitry, one or more application-specific integrated circuits (ASICs), general purpose processors (e.g., the processor 12), and/or field programmable gate arrays (FPGAs). Moreover, the amplitude information 58 and the phase information 62 may be in any suitable form interpretable by the polar amplitude DAC 72 and IQ RFDAC 76, which may depend on implementation. Furthermore, the amplitude information 58 and the phase information 62 may be calibrated or otherwise compensated by the digital processing 56 for any software or hardware effects such as phase path distortion, amplitude path distortion, mismatch (e.g., non-orthogonality) between I and Q signals (e.g., of the clock information 80), etc.

Moreover, in some embodiments, the digital processing 56 may generate a mode signal 85 to indicate the mode of operation (e.g., the combined IQ-polar mode or the IQ mode) to the IQ-polar RFDAC 52. For example, the mode signal 85 may enable the polar amplitude DAC 72 in the combined IQ-polar mode and disable the polar amplitude DAC 72 in the IQ mode. Additionally, the mode of operation may designate how the phase calculation 64 of the phase information 62 operates. For example, in the combined IQ-polar mode, the phase calculation 64 may output phase information 62 indicative of the polar coordinate phase component of the output RF signal 54, whereas in the IQ mode, the phase calculation 64 may output phase information 62 that includes I and Q signals such that the IQ REDAC 76 can directly generate the output RF signal 54 from the phase information 62. Furthermore, in some embodiments, the IQ mode may be entered based on a threshold desired output power of the output RF signal 54, below which the IQ mode is utilized, and above which the combined IQ-polar mode is utilized.

Figure 5:
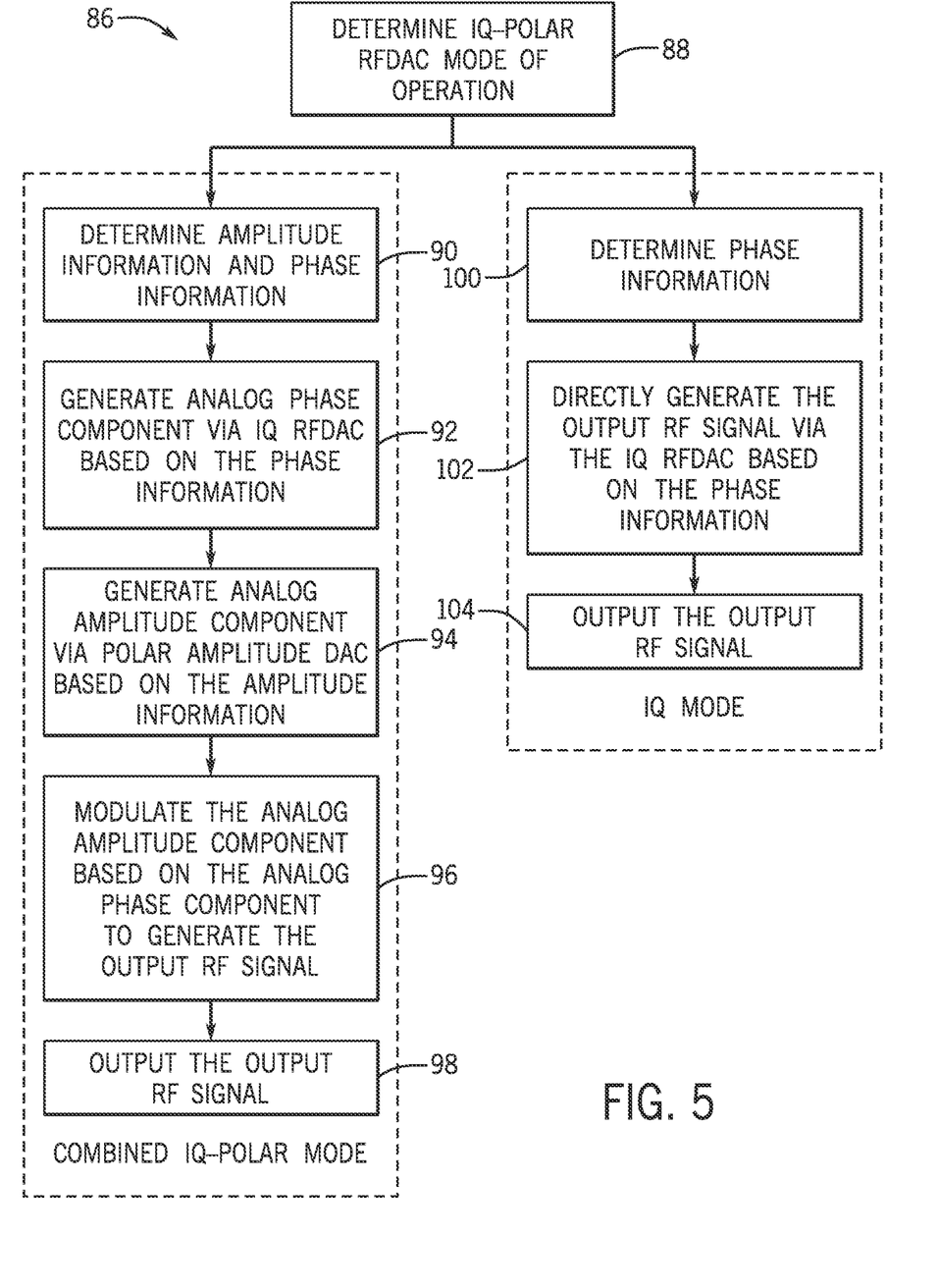
FIG. 5 is a flowchart of a method for generating an output RF signal using the IQ-polar RFDAC of FIG. 4, in accordance with an embodiment of the present disclosure.

FIG. 5 is a flowchart of a method 86 for utilizing the IQ-polar RFDAC to generate the output RF signal based on digital outgoing data 38, according to embodiments of the present disclosure. Any suitable device (e.g., a controller) that may control components of the electronic device 10, such as the processor 12, may assist in performing the method 86. In some embodiments, the method 86 may be implemented by executing instructions stored in a tangible, non-transitory, computer-readable medium, such as the memory 14 or storage 16, using the processor 12. For example, the method 86 may be performed at least in part by one or more software components, such as an operating system of the electronic device 10, one or more software applications of the electronic device 10, and the like. While the method 86 is described using steps in a specific sequence, it should be understood that the present disclosure contemplates that the described steps may be performed in different sequences than the sequence illustrated, and certain described steps may be skipped or not performed altogether.

In process block 88, the digital processing 56 or other circuitry may determine the mode of operation for the IQ-polar REDAC 52. For example, the digital processing 56 may determine to use the combined IQ-polar mode or the IQ mode in response to the desired output power being greater than a threshold or less than the threshold, respectively. Additionally, in some embodiments, the digital processing 56 may send a mode signal 85 to the IQ-polar REDAC 52 in response to determining the desired mode of operation.

In response to determining that the combined IQ-polar mode is to be utilized, the digital processing 56 may determine amplitude information and phase information based on the outgoing data 38, as in process block 90. In process block 92, an IQ REDAC within the IQ-polar REDAC 52 generates an analog phase component (e.g., of the output RF signal 54) based on the phase information 62. Additionally, in process block 94, the polar amplitude DAC of the IQ-polar REDAC 52 generates an analog amplitude component 66 (e.g., of the output RF signal 54) based on the amplitude information 58. In process block 96, the analog amplitude component 66 is modulated based on the analog phase component 68 to generate the output RF signal 54, and the output RF signal 54 is output from the IQ-polar RFDAC 52 in process block 98. As should be appreciated, in some embodiments, the modulation of the analog amplitude component 66 may occur simultaneous with the generation of the analog amplitude component 66 such that the output of the polar amplitude DAC 72 is the output RF signal 54. Indeed, the polar amplitude DAC 72 may or may not generate a signal of the pure analog amplitude component 66 without the analog phase component 68.

Returning to process block 88, in response to determining that the IQ mode is to be utilized, the digital processing 56 may determine phase information 62 based on the outgoing data 38, as in process block 100. As should be appreciated, in the IQ mode, the phase information 62 may include I and Q signals such that the IQ REDAC 76 directly generates the output RF signal 54 from the phase information 62. In process block 102, the IQ REDAC directly generates the output RF signal 54 based on the phase information 62, and in process block 104 the output RF signal 54 is output from the IQ-polar RFDAC 52. In this manner, the IQ-polar REDAC 52 may generate output RF signals 54 with increased efficiency, dynamic range, and bandwidth capabilities.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A combined radio frequency digital-to-analog converter (RFDAC) comprising:
    an in-phase and quadrature-(IQ-) based DAC configured to generate a phase component of an output RF signal and an amplitude component of the output RF signal based on the combined RFDAC operating in a first mode of operation; and
    a polar-based DAC comprising a plurality of digital power amplifiers, the polar-based DAC configured to generate the amplitude component of the output RF signal based on the combined RFDAC operating in a second mode of operation and based on disabling a set of digital power amplifiers of the plurality of digital power amplifiers, the first mode being associated with a lower output power of the output RF signal than the second mode.

2. The combined RFDAC of claim 1, wherein the polar-based DAC is configured to utilize the phase component as a clock such that the amplitude component and phase component are combined to generate the output RF signal.

3. The combined RFDAC of claim 1, wherein the IQ-based DAC comprises a current steering IQ RFDAC.

4. The combined RFDAC of claim 1, wherein the plurality of digital power amplifiers comprises a plurality of switch-capacitor power amplifiers.

5. The combined RFDAC of claim 1, wherein a number of the plurality of digital power amplifiers is enabled to generate the amplitude component, wherein the number scales with a value of the amplitude component.

6. The combined RFDAC of claim 1, wherein, in the second mode of operation, the IQ-based DAC is configured to output the output RF signal and bypass the polar-based DAC.

7. The combined RFDAC of claim 1, wherein a frequency of the phase component comprises a carrier frequency of the output RF signal.

8. A method comprising:
    generating, via a polar amplitude digital-to-analog converter (DAC) portion of an in-phase and quadrature-(IQ-) polar radio frequency (RF) DAC, an analog amplitude component of an output RF signal based on digital amplitude information when the IQ-polar RFDAC is operating in a first mode and based on disabling one or more digital power amplifiers; and
    generating, via an IQ RFDAC portion of the IQ-polar RFDAC, an analog phase component and the analog amplitude component of the output RF signal based on digital phase information when the IQ-polar RFDAC is operating in a second mode, the first mode being associated with a higher output power of the output RF signal than the second mode.

9. The method of claim 8, comprising receiving an indication of the first mode or the second mode as a mode of operation for the IQ-polar RFDAC.

10. The method of claim 9, wherein the indication is based on the output power of the output RF signal relative to a threshold power.

11. The method of claim 8, wherein the IQ RFDAC portion comprises a current steering RFDAC.

12. The method of claim 8, comprising frequency modulating the generating of the analog phase component to generate the output RF signal by clocking the generating of the analog amplitude component by the analog phase component.

13. The method of claim 8, comprising generating, via digital processing circuitry, the digital amplitude information and the digital phase information based on a digital data indicative of the output RF signal.

14. Radio-frequency (RF) transmission circuitry comprising:
    first digital-to-analog converter (DAC) circuitry configured to generate a phase modulated signal at a carrier frequency of an RF output signal of the RF transmission circuitry based on digital data indicative of the RF output signal, the phase modulated signal comprising a consistent amplitude based on the RF transmission circuitry operating in a first mode and comprising the RF output signal based on the RF transmission circuitry operating in a second mode, the first mode being associated with a higher output power of the output RF signal than the second mode; and second DAC circuitry comprising a plurality of digital power amplifiers, the second DAC circuitry configured to
- generate the RF output signal based on the digital data, the phase modulated signal, and the RF transmission circuitry operating in the first mode,
- generate an amplitude component of the output RF signal based on disabling at least one digital power amplifier of the plurality of digital power amplifiers, and
- be disabled based on the RF transmission circuitry operating in the second mode.

15. The RF transmission circuitry of claim 14, wherein the first DAC circuitry comprises an in-phase and quadrature (IQ) RF digital-to-analog converter (RFDAC) and the second DAC circuitry comprises one or more digital power amplifiers.

16. The RF transmission circuitry of claim 14, wherein the second mode corresponds to a higher power backoff of the RF output signal than the first mode.

17. The RF transmission circuitry of claim 14, comprising digital processing circuitry configured to generate amplitude information and phase information based on the digital data, wherein, based on the amplitude information based on the RF transmission circuitry operating in the first mode, the first DAC circuitry is configured to generate the phase modulated signal based on the phase information and the second DAC circuitry is configured to generate the RF output signal based on the amplitude information and the phase modulated signal.

18. The combined RFDAC of claim 1, comprising mode circuitry configured to operate the RFDAC in the first mode or the second mode.

19. The combined RFDAC of claim 18, wherein the mode circuitry is configured to operate the combined RFDAC in the first mode or the second mode based on receiving an indication of the output power of the output RF signal.

20. The method of claim 8, wherein the IQ-polar RFDAC comprises a modulator, and the output RF signal comprises a modulated signal.

* * * * *